(12) United States Patent
Haberecht

(10) Patent No.: US 8,372,298 B2
(45) Date of Patent: Feb. 12, 2013

(54) METHOD FOR PRODUCING EPITAXIALLY COATED SILICON WAFERS

(75) Inventor: Joerg Haberecht, Freiberg (DE)

(73) Assignee: Siltronic AG, Munich (DE)

( * ) Notice: Subject to any disclaimer, the term of this patent is extended or adjusted under 35 U.S.C. 154(b) by 210 days.

(21) Appl. No.: 12/698,175

(22) Filed: Feb. 2, 2010

(65) Prior Publication Data

US 2010/0213168 A1   Aug. 26, 2010

(30) Foreign Application Priority Data

Feb. 25, 2009   (DE) .......................... 10 2009 010 556

(51) Int. Cl.
*B44C 1/22* (2006.01)
*C03C 15/00* (2006.01)

(52) U.S. Cl. ................. 216/37; 216/63; 216/64; 216/74

(58) Field of Classification Search ..................... 216/67, 216/63, 37, 74
See application file for complete search history.

(56) References Cited

U.S. PATENT DOCUMENTS

| | | | |
|---|---|---|---|
| 5,400,548 A | | 3/1995 | Huber et al. |
| 5,790,750 A | * | 8/1998 | Anderson ...................... 392/416 |
| 5,814,239 A | * | 9/1998 | Kaneko et al. .................. 216/63 |
| 2001/0001384 A1 | | 5/2001 | Arai et al. |
| 2002/0022351 A1 | | 2/2002 | Schmolke et al. |
| 2002/0090818 A1 | | 7/2002 | Thilderkvist et al. |
| 2003/0186028 A1 | | 10/2003 | Wenski et al. |
| 2004/0115941 A1 | | 6/2004 | Siebert et al. |
| 2005/0247668 A1 | | 11/2005 | Malik et al. |
| 2007/0062438 A1 | | 3/2007 | Schauer et al. |
| 2007/0066036 A1 | | 3/2007 | Schauer et al. |

FOREIGN PATENT DOCUMENTS

| | | |
|---|---|---|
| DE | 19833257 C1 | 9/1999 |
| DE | 19938340 C1 | 2/2001 |
| DE | 10025871 A1 | 12/2001 |
| DE | 102005045339 A1 | 4/2007 |
| EP | 0272531 A1 | 6/1988 |
| EP | 0445596 B1 | 9/1991 |
| EP | 0547894 A1 | 6/1993 |
| EP | 0580162 A1 | 1/1994 |
| EP | 1643544 A1 | 5/2006 |
| JP | 2007-088469 A | 4/2007 |
| KR | 100772270 B1 | 10/2007 |
| WO | 2008056478 A1 | 5/2008 |

* cited by examiner

*Primary Examiner* — Nadine G Norton
*Assistant Examiner* — Mahmoud Dahimene
(74) *Attorney, Agent, or Firm* — Brooks Kushman P.C.

(57) ABSTRACT

Epitaxially coated silicon wafers, are coated individually in an epitaxy reactor by a procedure in which a silicon wafer on a susceptor in the epitaxy reactor, is pretreated in a first step with a hydrogen flow rate of 1-100 slm and in a second step with hydrogen and an etching medium at a hydrogen flow rate of 1-100 slm, and an etching medium flow rate of 0.5-1.5 slm, at an average temperature of 950-1050° C., and is subsequently coated epitaxially, wherein, during the second pretreatment step, the power of heating elements is regulated such that there is a temperature difference of 5-30° C. between a radially symmetrical central region of the silicon wafer and an outer region of the silicon outside the central region.

17 Claims, 1 Drawing Sheet

METHOD FOR PRODUCING EPITAXIALLY COATED SILICON WAFERS

CROSS-REFERENCE TO RELATED APPLICATIONS

This application is a continuation-in-part of German application DE 10 2009 010 556.5 filed Feb. 25, 2009, which is herein incorporated by reference.

BACKGROUND OF THE INVENTION

1. Field of the Invention

The invention relates to a method for producing epitaxially coated silicon wafers.

2. Background Art

Epitaxially coated silicon wafers are suitable for use in the semiconductor industry, in particular for the fabrication of large scale integrated electronic components such as microprocessors or memory chips. Starting materials (substrates) for modern microelectronics are required to meet stringent requirements for global and local flatness, thickness distribution, single-side-referenced local flatness (nanotopology) and freedom from defects.

Global flatness relates to the entire surface of a semiconductor wafer minus an edge exclusion to be defined. It is described by the GBIR ("global backsurface-referenced ideal plane/range"=magnitude of the positive and negative deviation from a backside-referenced ideal plane for the entire front side of the semiconductor wafer), which corresponds to the TTV ("total thickness variation") specification that was formerly customary.

The LTV ("local thickness variation") specification that was formerly customary is nowadays designated according to the SEMI standard by SBIR ("site backsurface-referenced ideal plane/range"=magnitude of the positive and negative deviation from a backside-referenced ideal plane for an individual component area of defined dimension) and corresponds to the GBIR or TTV of a component area ("site"). Therefore, in contrast to the global flatness GBIR, the SBIR is referenced to defined fields on the wafer, that is to say for example to segments of an area grid of measurement windows having a size of 26×8 mm² (site geometry). The maximum site geometry value $SBiR_{max}$ specifies the maximum SBIR value for the component areas taken into account on a silicon wafer.

Maximum site-referenced flatness or geometry values such as the SBiRmax are usually determined taking account of a certain edge exclusion (EE="edge exclusion") of 3 mm, by way of example. An area on a silicon wafer within a nominal edge exclusion is usually referred to as "Fixed Quality Area", abbreviated to FQA. Those sites which have part of their area lying outside the FQA, but the center of which lies within the FQA, are called "partial sites". The determination of the maximum local flatness often does not involve using the "partial sites", but rather only the so-called "full sites", that is to say the component areas lying completely within the FQA. In order to be able to compare maximum flatness values, it is essential to specify the edge exclusion and thus the size of the FQA and furthermore to specify whether or not the "partial sites" have been taken into account.

Furthermore, with regard to optimizing costs, it is frequently customary nowadays not to reject a silicon wafer owing, for example, only to a component area that exceeds the $SBIR_{max}$ value specified by the component manufacturer, but rather to permit a defined percentage, e.g. 1%, of component areas with higher values. The percentage of the sites which lie or are permitted to lie below a specific limit value of a geometry parameter is usually specified by a PUA ("Percent Useable Area") value, which, e.g. in the case of an $SBIR_{max}$ of less than or equal to 0.7 μm and a PUA value of 99%, states that 99% of the sites have an SBIRmax of less than or equal to 0.7 μm while higher SBIR values are also permitted for 1% of the sites ("chip yield").

According to the prior art, a silicon wafer can be produced by a process sequence of separating a single crystal of silicon into wafers, rounding the mechanically sensitive edges, and carrying out an abrasive step such as grinding or lapping followed by polishing. EP 547894 A1 describes a lapping method; grinding methods are disclosed in applications EP 272531 A1 and EP 580162 A1.

The final flatness is generally produced by the polishing step, which may be preceded, if appropriate, by an etching step for removing disturbed crystal layers and for removing impurities. A suitable etching method is known from DE 19833257 C1, by way of example. While the traditional single-side polishing methods generally lead to poorer plane-parallelisms, polishing methods acting on both sides ("double side polishing") make it possible to produce silicon wafers with improved flatness.

In the case of polished silicon wafers, therefore, the aim is to achieve the required flatness by suitable processing steps such as grinding, lapping and polishing. However, the polishing of a silicon wafer usually gives rise to a decrease in the thickness of the planar silicon wafer toward the edge ("edge roll-off"). Etching methods also tend to attack the silicon wafer to a greater extent at the edge and to produce such an edge roll-off.

In order to counteract the edge roll-off caused by etching and polishing, it is customary for silicon wafers to be polished concavely or convexly. A concavely polished silicon wafer is thinner in the center, then increases in its thickness toward the edge and has a decrease in thickness in an outer edge region. By contrast, a convexly polished silicon wafer is thicker in the center, then decreases in its thickness toward the edge and exhibits a pronounced decrease in thickness in an outer edge region.

DE 19938340 C1 describes depositing a monocrystalline layer on monocrystalline silicon wafers, the layer being composed of silicon with the same crystal orientation, a so-called epitaxial layer, on which semiconductor components are later applied. Systems of this type have certain advantages over silicon wafers made of homogeneous material, for example preventing charge reversal in bipolar CMOS circuits followed by short circuiting of the component ("latch-up"), lower defect densities, for example a reduced number of COPs ("crystal-originated particles"), and also the absence of an appreciable oxygen content, whereby it is possible to preclude a short-circuit risk caused by oxygen precipitates in component-relevant regions.

According to the prior art, epitaxially coated silicon wafers are produced from suitable intermediates by means of a process sequence of removal polishing—final polishing—cleaning—epitaxy.

DE 10025871 A1, for example, discloses a method for producing a silicon wafer with an epitaxial layer deposited on its front side, the method comprising the following process steps:

(a) a removal polishing step as the sole polishing step;
(b) (hydrophilic) cleaning and drying of the silicon wafer;
(c) pretreatment of the front side of the silicon wafer at a temperature of 950 to 1250 degrees Celsius in an epitaxy reactor; and (d) deposition of an epitaxial layer on the front side of the pretreated silicon wafer.

It is customary, in order to protect silicon wafers from particle loading, to subject the silicon wafers to a hydrophilic cleaning after polishing. The hydrophilic cleaning produces native oxide on the front and rear sides of the silicon wafer which is very thin (approximately 0.5-2 nm, depending on the type of cleaning and measurement). This native oxide is removed in the course of a pretreatment in an epitaxy reactor under a hydrogen atmosphere ("$H_2$ bake").

In a second step, the surface roughness of the front side of the silicon wafer is reduced and polishing defects are removed from the surface by usually small amounts of an etching medium, for example gaseous hydrogen chloride (HCl), being added to the hydrogen atmosphere.

Sometimes, besides an etching medium such as HCl, a silane compound, for example silane ($SiH_4$), dichlorosilane ($SiH_2Cl_2$), trichlorosilane (TCS, $SiHCl_3$) or tetrachlorosilane ($SiCl_4$), is also added to the hydrogen atmosphere in an amount such that silicon deposition and silicon etching removal are in equilibrium. Both reactions proceed at a sufficiently high reaction rate, however, so that silicon on the surface is mobile and the surface is smoothed and defects are removed on the surface.

Epitaxy reactors, which are used in particular in the semiconductor industry for the deposition of an epitaxial layer on a silicon wafer, are described in the prior art. During all coating or deposition steps, one or more silicon wafers are heated by means of heating sources, preferably by means of upper and lower heating sources, for example lamps or lamp banks, and subsequently exposed to a gas mixture, comprising a source gas, a carrier gas and, if appropriate, a doping gas.

A susceptor, which may be composed of graphite, SiC or quartz, for example, serves as a support for the silicon wafer in the process chamber of the epitaxy reactor. During the deposition process, the silicon wafer rests on this susceptor or in milled-out portions of the susceptor in order to ensure uniform heating and to protect the rear side of the silicon wafer, on which usually there is no deposition, from the source gas. In accordance with the prior art, the process chambers are designed for one or more silicon wafers.

In the case of silicon wafers having relatively large diameters (greater than or equal to 150 mm), single wafer reactors are usually used and the silicon wafers are processed individually, since this results in a good epitaxial layer thickness regularity. The uniformity of the layer thickness can be established by various measures, for example by altering the gas flows ($H_2$, $SiHCl_3$), by incorporating and adjusting gas inlet devices (injectors), by changing the deposition temperature, or by modifications to the susceptor.

In epitaxy it is furthermore customary, after one or more epitaxial depositions on silicon wafers, to carry out an etching treatment of the susceptor without a substrate, in the course of which the susceptor and also other parts of the process chamber are freed of silicon deposits. This etch, using hydrogen chloride (HCl), for example, is often carried out after the processing of only a small number of silicon wafers (e.g. after 1 to 5 silicon wafers) for single wafer reactors, and is not carried out in part until after the processing of more silicon wafers (e.g. after 10 to 20 silicon wafers) when depositing thin epitaxial layers. Usually, only an HCl etching treatment is used, or else an HCl etching treatment followed by brief coating of the susceptor.

The production of epitaxially coated silicon wafers with good global flatness proves to be extremely difficult since, as mentioned above, a concavely or convexly polished silicon wafer is usually present as the substrate.

Although the deposition of a thicker epitaxial layer in the center of the concavely polished silicon wafer, where the thickness of the layer decreases outwardly in the direction of the wafer edge could compensate for the originally concave form of the silicon wafer and thus also improve global flatness, this is not considered in the epitaxy of silicon wafers since an important specification of an epitaxially coated silicon wafer, namely a limit value for the uniformity of the epitaxial layer, will be exceeded. The same applies to methods which aim to first deposit a uniform epitaxial layer on a concave or convex polished wafer without influencing the geometrical form of the wafer, and subsequently to "etch into shape" the epitaxial layer or, by means of other material removal methods such as polishing, for example, in this way to improve the overall geometry of the epitaxially coated wafer. In this case, too, depending on the extent of the material removals required, an epitaxially coated wafer having an inhomogeneous epitaxial layer thickness results, which constitutes an unacceptable disadvantage. Therefore, methods of this type play practically no part in the epitaxy of monocrystalline silicon wafers having diameters of 300 mm or 450 mm for very modern applications in the semiconductor industry.

DE 102005045339 A1 discloses a method for producing epitaxially coated silicon wafers in which a multiplicity of silicon wafers, polished at least on their front sides, are successively coated individually in an epitaxy reactor by a procedure in which a respective one of the silicon wafers is placed on a susceptor in the epitaxy reactor and pretreated under a hydrogen atmosphere at a first hydrogen flow rate of 20-100 slm in a first step, and with addition of an etching medium to the hydrogen atmosphere at a second, reduced hydrogen flow rate of 0.5-10 slm in a second step, is subsequently coated epitaxially on its polished front side and then removed from the epitaxy reactor, and an etching treatment of the susceptor is furthermore effected in each case after a specific number of epitaxial coatings.

DE 102005045339 A1 likewise discloses a silicon wafer having a front side and a rear side, wherein at least its front side is polished and an epitaxial layer is applied at least on its front side, and which has a global flatness value GBIR of 0.07 0.3 µm, relative to an edge exclusion of 2 mm. The comparatively good geometry of this epitaxially coated silicon wafer results from the fact that the reduction of the hydrogen flow rate in the second step of the pretreatment with addition of an etching medium makes it possible to etch away material at the edge of the silicon wafer in a targeted manner and to actually globally level the silicon wafer before the epitaxial-coating step. Disadvantages of the method disclosed in DE 102005045339 are that although the reduced hydrogen flow rate intensifies the etching effect at the edge of the polished wafer, the gas flow over the semiconductor wafer is not laminar.

SUMMARY OF THE INVENTION

An object of the invention was to provide an alternative method for epitaxially coating silicon wafers such that epitaxially coated silicon wafers having good global flatness result. These and other objects are achieved by means of a method for producing epitaxially coated silicon wafers, in which a multiplicity of silicon wafers which are polished at least on their front sides are provided and successively coated individually in an epitaxy reactor by a procedure in which a respective one of the silicon wafers provided is placed on a susceptor in the epitaxy reactor, and is pretreated in a first step only under a hydrogen atmosphere at a hydrogen flow rate of 1-100 slm and in a second step with addition of an etching medium to the hydrogen atmosphere at a hydrogen flow rate of 1-100 slm, at a flow rate of the etching medium of 0.5-1.5 slm and at an average temperature of 950-1050° C., and is subsequently coated epitaxially on its polished front side and is removed from the epitaxy reactor, wherein, during the second step of the pretreatment, the power of heating elements arranged above and below the susceptor is regulated in such a way that there is a temperature difference of 5-30° C. between a radially symmetrical region, encompassing the central axis of the silicon wafer, and a part of the silicon wafer that lies outside that region.

DETAILED DESCRIPTION OF THE PREFERRED EMBODIMENT(S)

Figure 2:
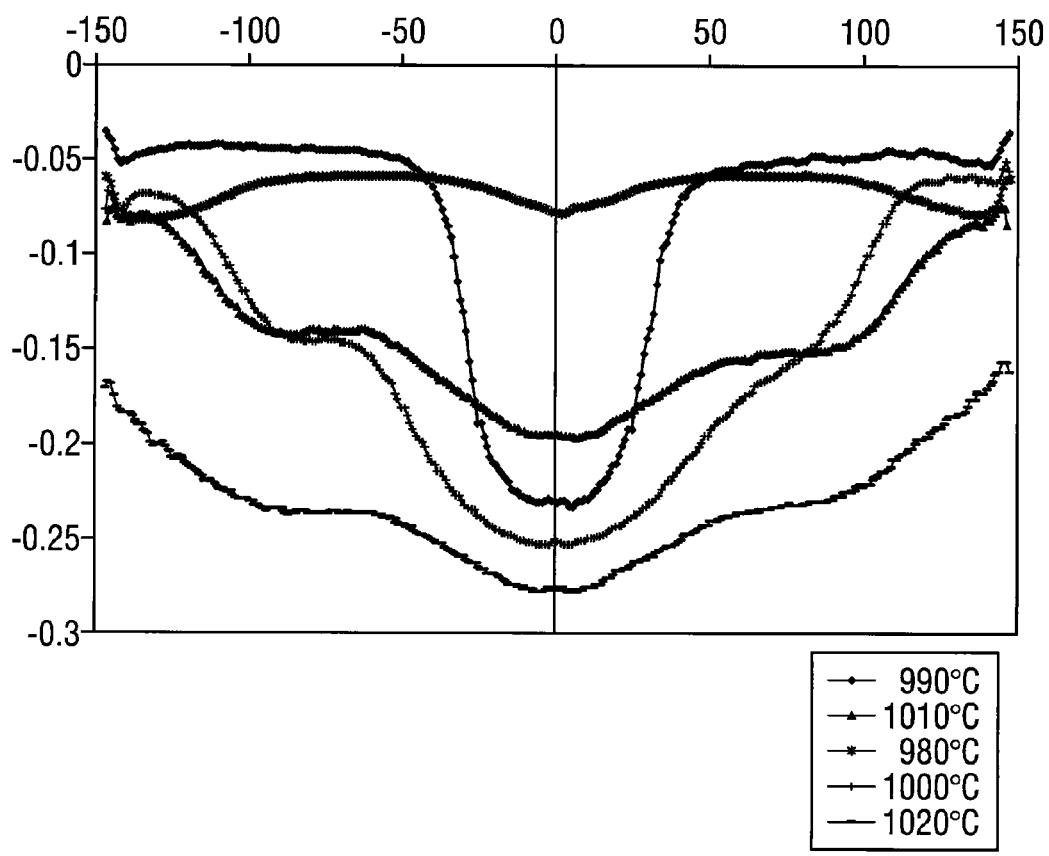
FIG. 2 shows the material removal at a polished silicon wafer having a diameter of 300 mm by etching pretreatment in an epitaxy reactor for various treatment temperatures.

The invention makes use of the fact that the removal rates during treatment of the silicon wafer with hydrogen and/or hydrogen plus etching medium are temperature-dependent, as is shown in FIG. 2.

The radially symmetrical region encompassing the central axis of the silicon wafer is preferably a region having an extent of 1-150 mm, if the diameter of the silicon wafer is 300 mm. By way of example, a circular region having a diameter of 1-150 mm can be involved, the midpoint of which corresponds to the center of the silicon wafer.

It is essential that the temperature in an inner zone around the center of the silicon wafer and susceptor (heating is effected from above and from below) is higher (or lower) than the temperature in an outer zone (edge region). On account of the temperature dependence of the removal rate, this has the consequence that the material removal is higher either in the inner zone or in the edge region. Thus, the convex or concave initial geometry of the polished wafer can be counteracted, the global geometry (TTV, GBIR) can be improved and, finally, an epitaxially coated silicon wafer having good geometry properties can be provided. The method according to the invention shows for the first time that the temperature range of 950-1050° C. is essential for this sculpturing of the wafer to take place.

The epitaxy reactor described in EP 0 445 596 B1, for example, is suitable for carrying out the method. It comprises a reactor chamber, consisting of a reactor vessel having a first dome and a second dome lying opposite the first dome, which are mechanically coupled, a holding device for holding a silicon wafer, and a heating device for heating the semiconductor wafer. The heating device comprises a first heating source which is situated outside the chamber and is arranged in such a way that energy is radiated through the first dome to the silicon wafer; and a second heating source which is likewise situated outside the chamber and is arranged in such a way that energy is radiated through the second dome to the silicon wafer. The reactor also has a gas inlet and outlet apparatus for introducing gases into the chamber and for evacuating gases from the chamber.

The heating of the silicon wafer and susceptor is therefore usually effected by heating elements arranged above and below the susceptor. IR lamps are involved in this case when using conventional epitaxy reactors such as the Epi Centura from Applied Materials, cf. EP 0 445 596 B1. The lamps can be arranged in a circular fashion, for example. However, other types of heating elements are also conceivable.

In addition, it is possible to regulate the power of the heating elements separately from one another. In the case of the IR lamp banks, it is possible to direct the thermal power in a targeted manner onto an inner region of the reactor chamber and separately therefrom onto an outer region of the reactor chamber. This is analogous to the already known possibility of distributing the gas flows in the reactor into a so-called inner zone and an outer zone.

The temperature difference between inner zone and outer zone, which is essential to the invention, can be realized through a suitable choice of the power of the heating elements which influence the temperature in the inner and outer regions.

As shown in FIG. 2 it is possible, through a suitable choice of the average temperature, to define, e.g., the extent of the material removal with regard to width and height in the center region of the silicon wafer. Therefore the temperature difference between regions of the silicon wafer and the choice of an average temperature of 950-1050° C. are essential to the invention.

In principle, in the method according to the invention, firstly a multiplicity of silicon wafers which are polished at least on their front sides are provided. For this purpose, a silicon single crystal produced according to the prior art, preferably by crucible pulling according to Czochralski, is sawn into a multiplicity of silicon wafers by means of known separation methods, preferably by wire sawing with free ("slurry") or bonded grain (diamond wire).

Furthermore, mechanical processing steps are effected, such as sequential single-side grinding methods (SSG), simultaneous double-side grinding methods ("double-disk grinding", DDG) or lapping. The edge of the silicon wafer including optionally present mechanical markings such as an orientation notch or an essentially rectilinear flattening of the silicon wafer edge ("flat") is generally processed as well (edge rounding, "edge-notch grinding").

Chemical treatment steps comprising cleaning and etching steps are additionally provided.

After the grinding, cleaning and etching steps, the surface of the silicon wafers is smoothed by removal polishing. In the case of single-side polishing (SSP), silicon wafers are held during processing on the rear side on a carrier plate by means of cement, by vacuum or by means of adhesion. In the case of double-side polishing (DSP), silicon wafers are inserted loosely into a thin toothed disk and polished on the front and rear side simultaneously in a manner "floating freely" between an upper and a lower polishing plate covered with a polishing cloth.

The front sides of the silicon wafers are then preferably polished in a haze-free manner, for example using a soft polishing cloth with the aid of an alkaline polishing sol. In order to obtain the required flatness of the silicon wafers produced up to this step, the material removals are relatively small in this case, preferably 0.05 to 1.5 µm. This step is often referred to as CMP polishing (chemo-mechanical polishing) in the literature.

After polishing, the silicon wafers are subjected to a hydrophilic cleaning and drying according to the prior art. The cleaning may be performed either as a batch method with simultaneous cleaning of a multiplicity of silicon wafers in baths, or by spraying methods, or else as a single wafer process.

The silicon wafers provided are preferably wafers made of monocrystalline silicon material, SOI ("silicon-on-insulator") wafers, silicon wafers having strained silicon layers ("strained silicon") or sSOI ("strained silicon-on-insulator") wafers. Methods for producing SOI or sSOI wafers such as SmartCut™ and methods for producing wafers with strained silicon layers are known in the prior art.

The polished silicon wafers provided are subsequently individually pretreated in an epitaxy reactor. The pretreatment comprises a treatment of the silicon wafer in a hydrogen atmosphere ($H_2$ bake) and a treatment of the silicon wafer with addition of an etching medium to the hydrogen atmosphere, in each case in a temperature range of 950 to 1050° C. The etching medium is preferably hydrogen chloride (HCl).

The pretreatment in a hydrogen atmosphere is effected at a hydrogen flow rate of 1-100 slm (standard liter per minute), more preferably 40-60 slm, and the duration of the pretreatment in a hydrogen atmosphere is preferably 10-120 s.

During pretreatment with the etching medium, the flow rate of the etching medium is preferably 0.5-1.5 slm, and the hydrogen flow rate is also 1-100 slm, more preferably 40-60 slm, during the pretreatment with the etching medium.

During the second step of the pretreatment, the power of the heating elements arranged above and below the susceptor is regulated in such a way that a radially symmetrical central region encompassing the central axis of the silicon wafer to be epitaxially coated, and having a diameter of 1-150 mm, has its temperature increased (or decreased) by 5-30° C. relative to that part of the silicon wafer which lies outside the central region.

A treatment duration of 10-120 s is preferred, most preferably 20-60 s, during the HCl etching treatment, depending on the desired material removal at the edge of the silicon wafer to be epitaxially coated.

The particular advantage of this method is that after the pretreatment steps the silicon wafer obtains an optimum form of the front side for the subsequent deposition of an epitaxial silicon layer since the convex or concave form of the silicon wafer is compensated for by the pretreatment of the silicon wafer.

In the method according to the invention, the inner zone preferably corresponds to a circle having a diameter of 1-150 mm around the center of the silicon wafer, while the outer zone corresponds to a ring having a width of 1-150 mm which preferably encompasses the edge of the silicon wafer. These values correspond to the application of the invention to silicon wafers having a diameter of 300 mm. With the use of silicon wafers of the next generation having a substrate diameter of 450 mm, inner and outer zones are chosen accordingly, likewise in the case of smaller substrates such as 200 mm or 150 mm wafers.

The invention makes it possible to choose the size outer zone(s) depending on the initial geometry of the silicon wafer to be epitaxially coated. Preferably, the initial geometry of the polished wafer is first determined in a batch of silicon wafers to be epitaxially coated, and then the corresponding process settings for the pretreatment steps in the epitaxy reactor are chosen, e.g. the radial extent of the inner zone, the lamp power, and the temperature difference between inner and outer zones during the etching treatment in the reactor. Of course, it is also possible to have a central zone and a plurality of radially symmetrical outer zones, the temperature of each zone being independently selectable within the above temperature ranges.

After the pretreatment steps, an epitaxial layer is deposited at least on the polished front side of the silicon wafer. For this purpose, a silane source as source gas is added to hydrogen as a carrier gas. The epitaxial layer is deposited at a temperature of 900-1200° C. depending on the silane source used. Trichlorosilane (TCS) is preferably used as the silane source, at a deposition temperature of 1050-1150° C., which therefore lies above the temperature range essential during the pretreatment steps. The thickness of the deposited epitaxial layer is preferably 0.5-5 μm. After the deposition of the epitaxial layer, the epitaxially coated silicon wafer is removed from the epitaxy reactor.

After a specific number of epitaxial depositions on silicon wafers, the susceptor is treated with an etching medium, preferably with HCl, in order to free the susceptor of silicon deposits, by way of example. A susceptor etching is preferably effected after 1-15 epitaxial coatings of silicon wafers. For this purpose, the epitaxially coated silicon wafer is removed and the substrate-free susceptor is treated with HCl. Preferably, besides the susceptor surface, the entire process chamber is flushed with hydrogen chloride in order to remove silicon deposits.

The susceptor is preferably coated with silicon after the susceptor etching and before further epitaxial processes. This may be advantageous since the silicon wafer to be epitaxially coated does not then bear directly on the susceptor.

Moreover, it has been surprisingly and unexpectedly discovered that the method according to the invention is suitable for producing a silicon wafer which comprises a front side and a rear side, wherein at least its front side is polished and an epitaxial layer is applied at least on its front side, which has a global flatness value GBIR of 0.02 to 0.06 μm, relative to an edge exclusion of 2 mm. If an edge exclusion of 1 mm is employed, that is to say a more stringent criterion, this results in GBIR values of 0.04 to 0.08 μm.

The local flatness, expressed by the $SBIR_{max}$, in the case of the silicon wafer epitaxially coated according to the invention, is greater than or equal to 0.02 μm and less than or equal to 0.05 μm, likewise given an edge exclusion of 2 mm and relative to partial regions of an area grid of segments having a size of 26×8 $mm^2$. This results in 336 segments, of which 52 are "partial sites". The "partial sites" are preferably taken into account in the determination of the $SBIR_{max}$. The PUA value is preferably 100%. Relative to an edge exclusion of 1 mm, an $SBIR_{max}$ of 0.04 to 0.07 μm results.

The silicon wafer is preferably a wafer made of monocrystalline silicon material, an SOI("silicon-on-insulator") wafer, a silicon wafer with a strained silicon layer ("strained silicon") or an sSOI("strained silicon-on-insulator") wafer which is provided with an epitaxial layer.

The epitaxially coated silicon wafer according to the invention preferably has an epitaxial layer thickness uniformity of at most 2.0%. The epitaxial layer thickness uniformity can be determined by measuring an average value t and range $\Delta t = t_{max} - t_{mm}$ of the epitaxial layer thickness. $\Delta t/t$ is more preferably 0.5%-2.0%, and most preferably 1.0%-1.5%. The method according to the invention, for the gas flows and gas flow distributions claimed, permits the production of epitaxially coated silicon wafers having these epitaxial layer thickness uniformities.

If as, in the prior art, attempts are made to correct the concave initial geometry of the polished silicon wafer by a procedure in which a thicker (or thinner)epitaxial layer is deposited in the center of the silicon wafer during epitaxy, or by a procedure in which a largely regular epitaxial layer is first deposited and the concave geometry of the epitaxially coated wafer is subsequently corrected by etching removal at the epitaxial layer, it is impossible to keep the epitaxial layer thickness uniformity parameter, which is extremely important and critical for the component manufacturers, in that narrow range of less than or equal to 2%.

EXAMPLE

The example relates employs an epitaxy reactor of the type Epi Centura from Applied Materials. A schematic construction of the reactor chamber of such an installation is shown in FIG. 1.

Figure 1:
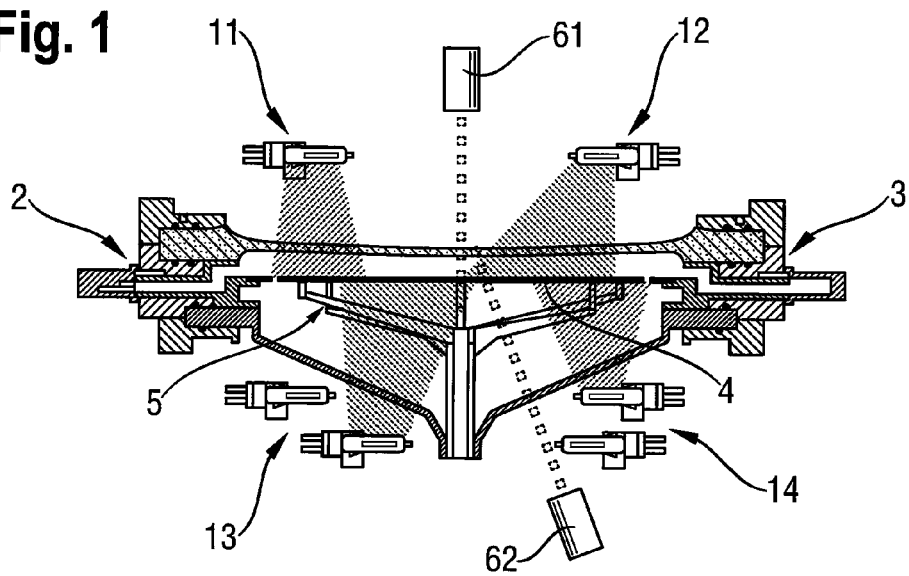
FIG. 1 shows the schematic construction of a reactor chamber of an epitaxy reactor for carrying out the method.

FIG. 1 illustrates the schematic construction of a reactor chamber for carrying out the method according to the invention. Heating elements 11 (top, outer region), 12 (top, inner region), 13 (bottom, inner region) and 14 (bottom, outer region) are illustrated. The reactor comprises a susceptor 4 for receiving the silicon wafer to be epitaxially coated, a gas inlet apparatus 2, a gas outlet apparatus 3, an apparatus 5 for mounting and for lifting susceptor and substrate (e.g. by means of so-called lift pins), and pyrometers 61 and 62 for contactlessly measuring the temperature in the reactor chamber.

Table 1 now shows by way of example typical values for lamp powers in the case of the Epi Centura which create the temperature difference, essential to the invention, between inner and outer zones. In this case, the total lamp power is 70 kW, distributed among the four lamp banks illustrated in FIG. 1 (top/inside, top/outside, bottom/inside, bottom/outside). This corresponds to an average temperature in the chamber of approximately 950-1050° C. 60% of the total power comes from the upper lamp banks or heating elements.

TABLE 1

| Total power | | Upper heating elements | | Lower heating elements | |
|---|---|---|---|---|---|
| 70 kW | | 25 kW = 60% of 70 kW | | 45 kW = 40% of 70 kW | |
| | Distribution inside/outside | Inside | Outside | Inside | Outside |
| | Epitaxial coating | 13.5 kW = 54% of 25 kW | 11.5 kW | 5.85 kW = 13% of 45 kW | 39.15 kW |
| | Etching pretreatment | 16.5 kW = 66% of 25 kW | 8.5 kW | 7.2 kW = 16% of 45 kW | 37.8 kW |

The distribution of the lamp power between inside/outside is different during the etching pretreatment than during the epitaxial coating. In the Epi Centura reactor the distribution of 54%/13% leads to a homogeneous temperature distribution between silicon wafer and susceptor. Here the temperature is substantially identical in all regions of the silicon wafer. In order to achieve a homogeneous temperature distribution, an optimum energy distribution has to be determined for each reactor chamber. This energy distribution can vary in different reactor chambers even of the same reactor type (e.g. Epi Centura).

The following procedure is preferably adopted for determining the optimum energy distribution for the epitaxy step: a group of p-wafers (e.g. five wafers) each having a substrate resistance >10 ohm cm is used. Different energy distributions are set for each wafer (e.g. wafer 1:54%/13% . . . wafer 2:58%/14%, etc.). The five wafers are then measured for example using an SP1 light scattering measurement instrument from KLA Tencor and, if necessary, examined under a microscope. An average setting is chosen for the further epitaxy steps. The aim is to achieve an energy distribution that is as homogeneous as possible over the silicon wafer for the epitaxy step. This procedure is also referred to as "running a slip window" among experts in the field of semiconductor epitaxy.

In the course of production, wafers are regularly examined for possible slips. If there are slips on the wafers, the "slip window" is run in order once again to determine an optimum setting of the energy distribution.

In the present invention, preferably proceeding from an energy distribution optimized in such a manner for the epitaxy process, the power is increased (or decreased) in the inner zone for the etching pretreatment in order to obtain the required temperature difference between inner and outer zones.

If, for the epitaxy process, for example, an optimized value of 54% or 62% results for the power of the upper heating elements into the inner zone for a homogeneous temperature distribution over the whole wafer, then a value of 66% or 72%, respectively is preferred for the etching pretreatment. During the etching pretreatment, therefore, the energy distribution proceeding from the previous optimization is always chosen differently in order to achieve the temperature difference essential to the invention of 5-30°.

The distribution of 66%/16% from Table 1 leads to a temperature difference of approximately 20° C. Variations of this distribution make it possible to set the temperature difference in the entire range claimed.

FIG. 2 shows the material removal from silicon wafers having a diameter of 300 mm (therefore the inscription on the axis is from −150 mm to +150 mm) as a function of the average temperature of the silicon wafer. The distribution 66%/16% from table 1 was used in the pretreatment steps.

The temperature difference between inner and outer zones of the silicon wafer was therefore approximately 20° C.

It is evident that the material removal in the inner region of the silicon wafer around the center thereof (x-axis=0) exhibits a significant temperature dependence. A temperature of 980° C. and 1000° C. and 1020° C. exhibits an etching removal profile that is particularly suitable for correcting the geometry for most convexly polished silicon wafers in a particularly advantageous manner. Therefore, this temperature range is especially preferred for the method according to the invention.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A method for producing epitaxially coated silicon wafers, in which a multiplicity of silicon wafers which are polished at least on their front sides are provided and successively coated individually in an epitaxy reactor, comprising:
   placing a respective silicon wafer on a susceptor in the epitaxy reactor, and pretreating the wafer in a first step under a hydrogen atmosphere at a hydrogen flow rate of 1-100 slm; and increasing the global flatness of the wafer by pretreating the wafer in a second step with addition of an etching medium to the hydrogen atmosphere, at a hydrogen flow rate of 1-100 slm, and a flow rate of the etching medium of 0.5-1.5 slm, the pretreating taking place at an average temperature of 950-1050° C., wherein, during at least the second step of pretreating, the power of heating elements arranged above and below the susceptor is regulated such that there is a temperature difference of 5-30° C. between a radially symmetrical central region of the silicon wafer to be epitaxially coated, and an outer portion of the silicon wafer which lies outside the central region, and subsequently epitaxially coating the wafer on its polished front side and removing the wafer from the epitaxy reactor.

2. The method of claim 1, wherein the hydrogen flow rate is 40-60 slm in both pretreating steps.

3. The method of claim 1, wherein the duration of the pretreating is 10-120 s in both pretreating steps.

4. The method of claim 1, wherein a temperature difference of 10-20° C. between a central region and an outer region prevails on the silicon wafer during the second step of pretreatment.

5. The method of claim 1, wherein both pretreating steps are effected at an average temperature of 950-1050° C.

6. The method of claim 1, wherein the second step of pretreating is effected at an average temperature of 980-1020° C.

7. The method of claim 1, wherein the radially symmetrical central region of the silicon wafer has at most a diameter of 50% of the diameter of the silicon wafer.

8. The method of claim 1, wherein the silicon wafer has a diameter of 300 mm and the radially symmetrical central region of the silicon wafer has a diameter of 1-150 mm.

9. The method of claim 1, wherein the silicon wafer has a diameter of 450 mm and the radially symmetrical central region of the silicon wafer has a diameter of 1-250 mm.

10. The method of claim 1, wherein epitaxially coating is effected in a temperature range of 950 to 1200° C. and with a homogeneous temperature distribution on the silicon wafer and susceptor.

11. The method of claim 1, wherein the heating elements are IR lamps.

12. The method of claim 1, wherein the silicon wafers are wafers composed of monocrystalline silicon, SOI ("silicon-on-insulator") wafers, silicon wafers with strained silicon layers, or sSOI ("strained silicon-on-insulator") wafers, in each case having a diameter of 150 mm, 200 mm, 300 mm or 450 mm.

13. A method of epitaxially coating a silicon wafer to provide a uniform epitaxial coating with a uniformity $\Delta t/t$ of 2.0% or less on a polished wafer initially having a substantially concave or convex surface where t is the average thickness of the epitaxial coating and $\Delta t$ is the difference between the maximum thickness and minimum thickness of the epitaxial coating, comprising sculpting the surface of the wafer to be epitaxially coated by a two step pretreatment in an epitaxy reactor, a first pretreatment with hydrogen at a flow rate of 1-100 slm, and a second pretreatment with hydrogen at a flow rate of 1-100 slm with the addition of an etching gas at a flow rate of 0.5-1.5 slm, the pretreatment taking place at an average temperature of about 950° C. to 1050° C., wherein the wafer is divided into a plurality of radially symmetrical zones, and the temperature of zone(s) of increased thickness is increased relative to zone(s) of lesser thickness during the second pretreatment such that an increased etching removal rate occurs on zone(s) of increased thickness reducing the thickness variation, and subsequently epitaxially coating the wafer thus treated.

14. The method of claim 1, wherein the average temperature of the wafer in the second step is 980° C. to 1050° C.

15. The method of claim 1, wherein the average temperature of the wafer in the second step is 980° C. to 1020° C. wherein the wafer, prior to the second step, has a convex geometry.

16. The method of claim 13, wherein the average temperature of the wafer in the second step is 980° C. to 1050° C.

17. The method of claim 13, wherein the average temperature of the wafer in the second step is 980° C. to 1020° C. wherein the wafer, prior to the second step, has a convex geometry.

* * * * *